(12) United States Patent
Jung

(10) Patent No.: US 7,795,084 B2
(45) Date of Patent: Sep. 14, 2010

(54) SEMICONDUCTOR DEVICE AND FABRICATING METHOD THEREOF

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/576,714

(22) Filed: Oct. 9, 2009

(65) Prior Publication Data

US 2010/0029051 A1 Feb. 4, 2010

Related U.S. Application Data

(62) Division of application No. 11/026,972, filed on Dec. 30, 2004, now Pat. No. 7,622,764.

(30) Foreign Application Priority Data

Dec. 31, 2003 (KR) .................... 10-2003-0101101

(51) Int. Cl.
*H01L 21/336* (2006.01)
(52) U.S. Cl. ...................................... 438/197
(58) Field of Classification Search ................ 257/239, 257/261, 314–317, 320, 321, E29.129, E29.3, 257/E21.179, E21.422, E21.68, E21.687, 257/E21.688, 318; 438/954; 365/185.28, 365/104, 185.83
See application file for complete search history.

(56) References Cited

U.S. PATENT DOCUMENTS

| 4,698,787 | A  | * | 10/1987 | Mukherjee et al. | ..... 365/185.29 |
| 5,358,885 | A  | * | 10/1994 | Oku et al. | .................... 438/571 |
| 5,455,792 | A  | * | 10/1995 | Yi | .......................... 365/185.15 |
| 6,639,269 | B1 | * | 10/2003 | Hofmann et al. | ............ 257/316 |
| 6,770,934 | B1 | * | 8/2004  | Hung et al. | .................. 257/331 |
| 6,873,006 | B2 | * | 3/2005  | Chen et al. | ................... 257/316 |
| 6,897,520 | B2 | * | 5/2005  | Vora | ........................... 257/316 |
| 6,906,379 | B2 | * | 6/2005  | Chen et al. | ................... 257/315 |
| 6,936,883 | B2 | * | 8/2005  | Chen et al. | ................... 257/315 |
| 6,952,034 | B2 | * | 10/2005 | Hu et al. | ...................... 257/315 |
| 2002/0096703 | A1 | * | 7/2002 | Vora | ........................... 257/315 |
| 2004/0183118 | A1 | * | 9/2004 | Chen et al. | ................... 257/314 |

(Continued)

FOREIGN PATENT DOCUMENTS

KR  10-2003-0051038  6/2003

*Primary Examiner*—Dao H Nguyen
*Assistant Examiner*—Tram H Nguyen
(74) *Attorney, Agent, or Firm*—Saliwanchik, Lloyd & Saliwanchik

(57) ABSTRACT

Semiconductor devices and a fabricating method therefore are disclosed. One method includes forming a buffer oxide layer and a buffer nitride layer on the top surface of a semiconductor substrate; forming a photoresist pattern on the pad nitride layer and forming a trench by etching the buffer nitride layer, the buffer oxide layer and the semiconductor substrate by a predetermined etch using the photoresist pattern as a mask; forming sidewall floating gates on the lateral faces of the trench; depositing polysilicon on the entire surface of the resulting structure; forming a gate electrode by patterning the polysilicon of the resulting structure; removing the buffer nitride layer and forming a poly oxide layer on the exposed part of the polysilicon of the gate electrode; forming source/drain regions by implanting impurities into the predetermined part of the resulting structure; injecting electric charges into the sidewall floating gates; and forming spacers on the lateral faces of the sidewall floating gates and the gate electrode.

11 Claims, 7 Drawing Sheets

U.S. PATENT DOCUMENTS

2004/0197996 A1* 10/2004 Chen et al. .................. 438/259
2004/0253787 A1* 12/2004 Lee et al. .................... 438/257
2005/0026365 A1* 2/2005 Ding .......................... 438/257
2005/0045942 A1* 3/2005 Jung .......................... 257/316

* cited by examiner

SEMICONDUCTOR DEVICE AND FABRICATING METHOD THEREOF

CROSS-REFERENCE TO RELATED APPLICATIONS

This application is a divisional of U.S. application Ser. No. 11/026,972, filed Dec. 30, 2004 now U.S. Pat. No. 7,662,764, which claims the benefit of Korean Application No. 10-2003-0101101, filed on Dec. 31, 2003, which are hereby incorporated herein by reference in their entirety.

TECHNICAL FIELD

The present disclosure relates generally to semiconductor devices and, more particularly, to semiconductor devices and fabrication methods thereof.

BACKGROUND

Flash memory devices, which are nonvolatile memory devices, can maintain data in memory cells even if electric power is removed from the device. Additionally, flash memory devices may be electrically erased at high speeds on a circuit board.

The technologies for the flash memory devices have continuously advanced by developing various cell structures such as stacked gate cells, split gate cells, source side injection cells and etc. U.S. Pat. No. 5,455,792 describes such various cell structures.

The stacked gate cell configuration includes a floating gate and a control gate formed on the floating gate. U.S. Pat. No. 4,698,787 describes one embodiment of the stacked gate cell. Referring to FIG. 1, a floating gate 11 is formed on a substrate 10. A control gate 12 is formed on the floating gate 11. An ONO (Oxide-Nitride-Oxide) layer (not shown) may be formed between the control gate 12 and the floating gate 11. Program operations are performed in a drain region 14 through a CHEI (Channel Hot Electron Injection). Erase operations are performed in a source region 13 though F-N (Fowler-Nordheim) tunneling. Because the size of a resulting cell is relatively small, the stacked gate cell has been prevalently used as the unit cell of flash memory devices.

On the other hand, U.S. Pat. No. 5,358,885 discloses a method for fabricating a T-shaped gate electrode (i.e., the upper part of the gate electrode is larger than the lower part of the gate electrode) for reduced resistance between the T-shaped gate electrode and a source region. Korean Patent Publication No. 2003-51038 discloses a method for fabricating a T-shaped gate electrode by forming damascene structures and, particularly, a method for preventing the deterioration of a metallic salicide layer in a later thermal process and reducing the resistance of the T-shaped gate electrode by enlarging the area for the metallic salicide layer on the gate electrode.

According to conventional methods, dopants in source and drain extension regions are diffused toward a channel region by a later thermal treatment. Thus, if the width of a gate electrode is less than 0.06 micrometers ($\mu m$), the source region will be connected to the drain region. Thus, a metal oxide semiconductor (MOS) transistor is virtually impossible to achieve. Moreover, even if the width of the gate electrode is more in width than 0.06 $\mu m$, the depth of the source and drain junctions have to be less than 10 $\mu m$, therefore causing serious short channel effects. In addition, as the design size of a transistor decreases, the depth of the source and drain junctions has to be proportionally shallow, thereby causing several problems such as parasitic resistances and junction leakages due to the silicide layer later formed on the shallow source and drain regions.

Accordingly, various elevated source and drain structures have been suggested to solve such problems in conventional arts. However, the elevated source and drain structures require additional selective epitaxial processes, thereby increasing manufacturing cost, and presenting difficulties in the implementation of a manufacturing process.

DETAILED DESCRIPTION

Disclosed herein are methods for forming extremely narrow source and drain extension regions, that suppress the occurrences of the short channel effect in a nano-scaled MOS transistor.

Figure 1:
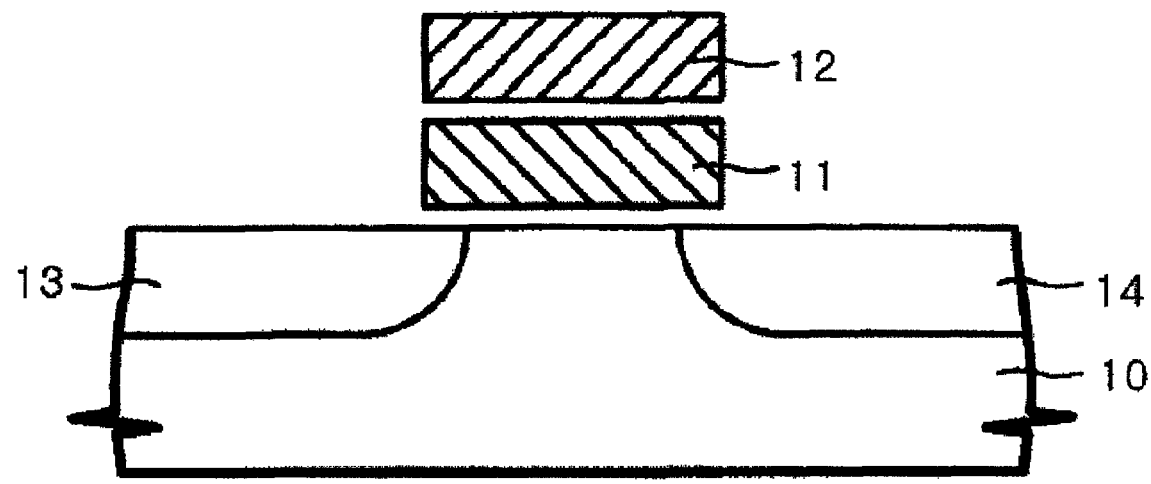
FIG. 1 is a cross-sectional view illustrating a known flash memory device stacked gate cell structure.
Figure 2:
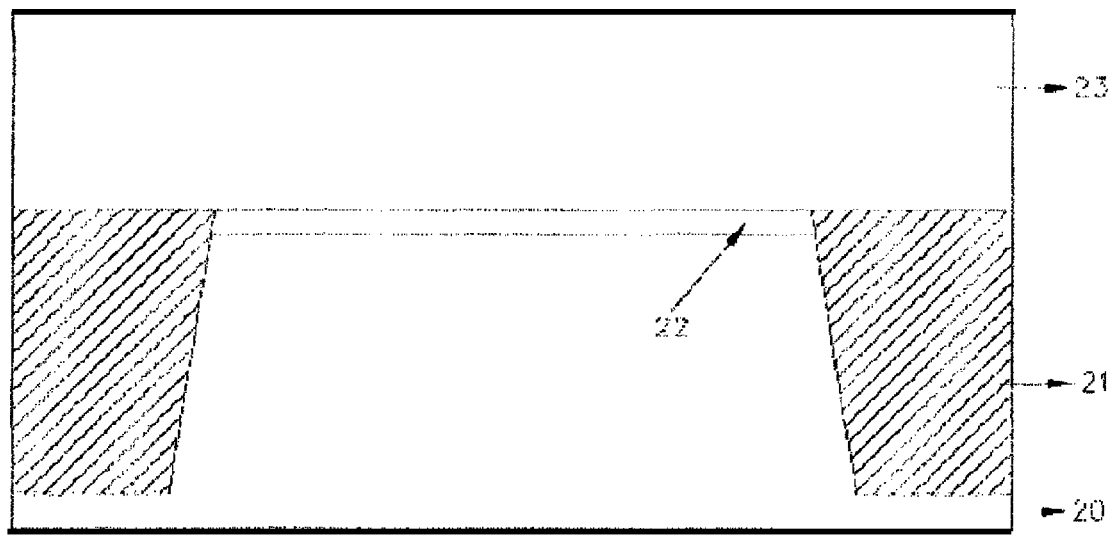
FIGS. 2 through 8 are cross-sectional views of semiconductor devices at various fabrication stages according to the disclosed methods.

Referring to FIG. 2, shallow trench isolation (hereinafter referred to as "STI") structures 21 are formed on a semiconductor substrate 20 by a conventional STI formation method. A screen oxide layer (not shown) is then formed to reduce damages due to the next ion implantation process. Subsequently, an N-well or a P-well is formed by an ion implantation process. Other ion implantation processes may be respectively performed for controlling a threshold voltage, preventing a punch-through or adjusting the threshold voltage of a transistor field while the wells are formed. The screen oxide layer (not shown) is then removed. Subsequently, a buffer oxide layer 22 is formed on an active region between the trenches 21. A buffer nitride layer 23 is then deposited on the entire surface of the resulting structure.

Figure 3:
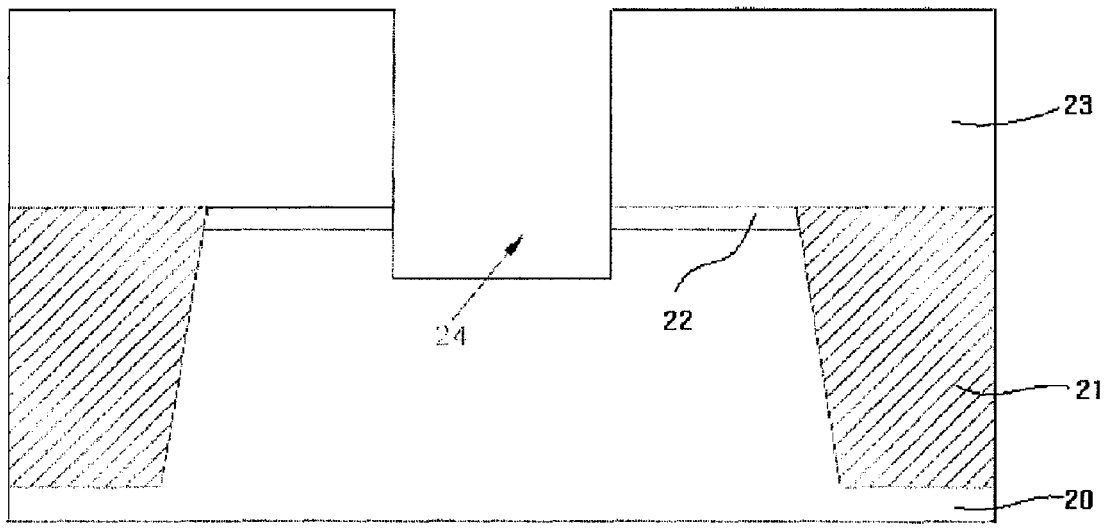

Referring to FIG. 3, a photoresist pattern (not shown) is formed on the buffer nitride layer 23 through a conventional photolithography process. Subsequently, through the use of the photoresist pattern, the buffer nitride layer 23, the buffer oxide layer and the semiconductor substrate 20 are etched to make a trench 24, under which source and drain extension regions (not shown) will be formed. The etching depth of the trench 24 is dependent on both the depth of source and drain regions and the thickness of a silicide layer to be formed on the source and drains regions and, preferably, between 200 Å and 2000 Å.

Figure 4:
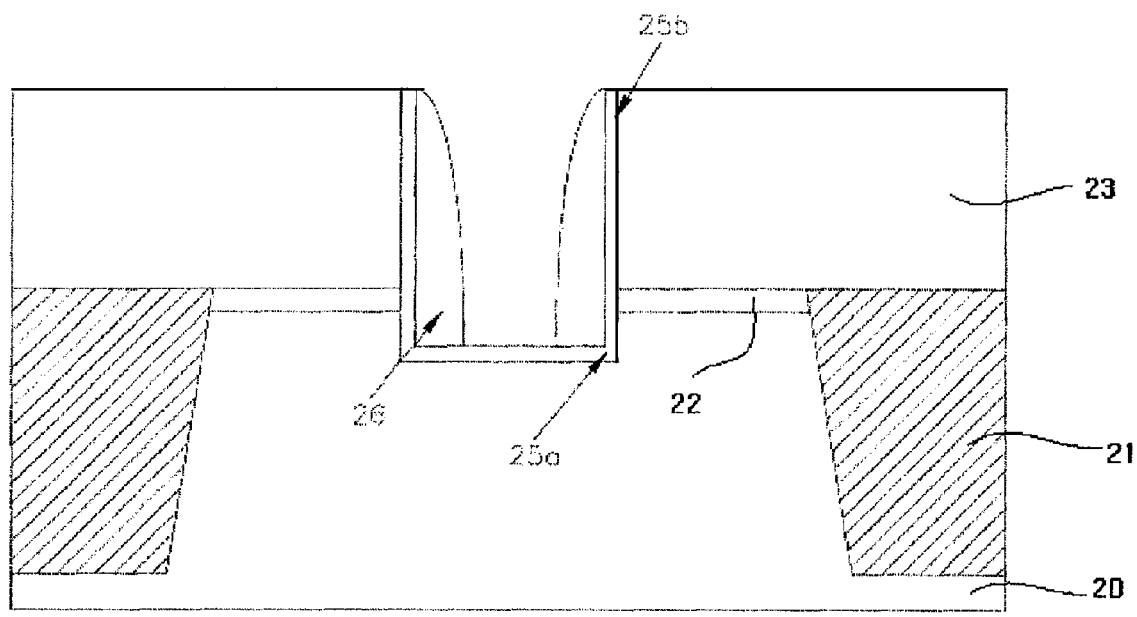

Referring to FIG. 4, an oxide layer is deposited on the trench 24, becoming a first gate oxide layer 25a on the bottom of the trench 24 and a first block oxide layers 25b on the lateral faces of the trench 24. Subsequently, polysilicon is deposited on the entire surface of the resulting structure. After a photoresist pattern is formed by a common photolithography process, sidewall floating gates 26 are formed by etching the predetermined part of the polysilicon using the photoresist pattern as a mask. Preferably, a blanket etching is employed. The width of the sidewall floating gates 26 is dependent on the length of the source and drain extension regions (not shown) and, preferably, between 300 Å and 2000 Å.

Figure 5:
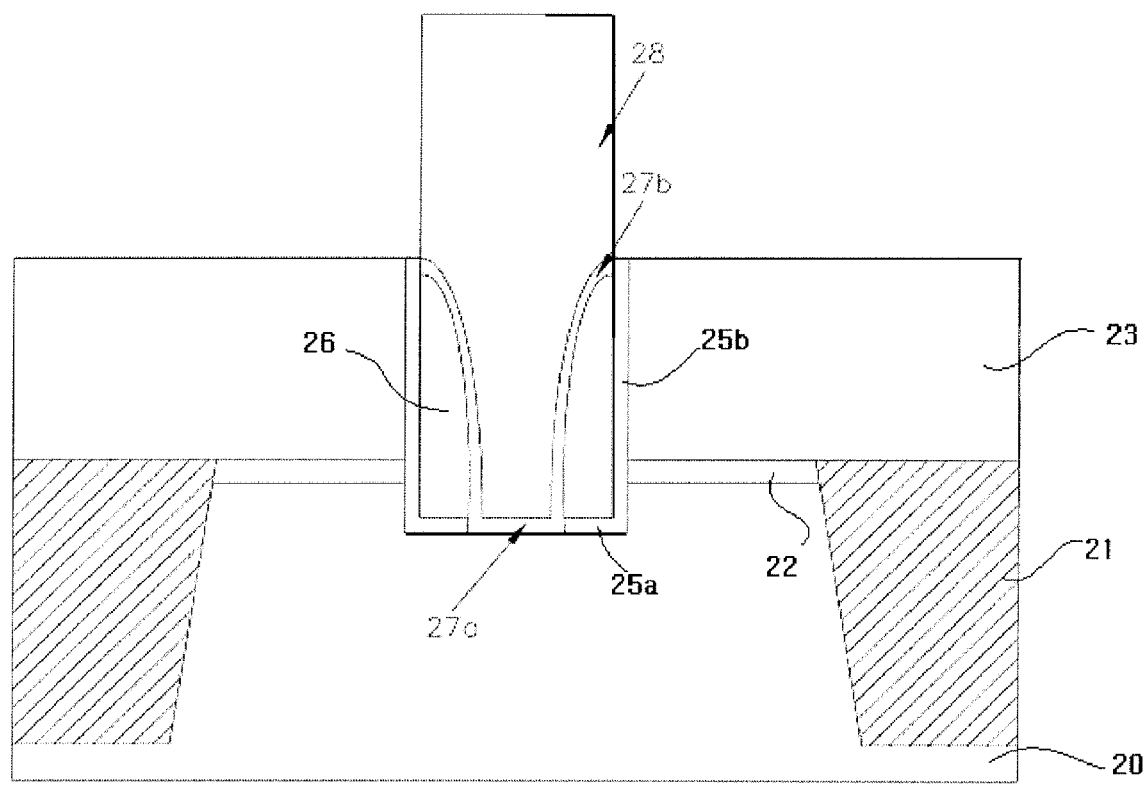

Referring to FIG. 5, the exposed part of the first gate oxide layer 25a between the sidewall floating gates 26 is removed. Subsequently, an oxide layers is deposited, becoming a second gate oxide layer 27a where the first gate oxide layer 25a is removed and second block oxide layers 27b on the surfaces of the floating gates 26. Subsequently, a polysilicon layer for a gate electrode 28 is deposited on the entire surface of the resulting structure. After photoresist pattern is the formed on the polysilicon layer by a common photolithography process, a gate electrode 28 is formed by removing a predetermined part of the polysilicon layer.

Figure 6:
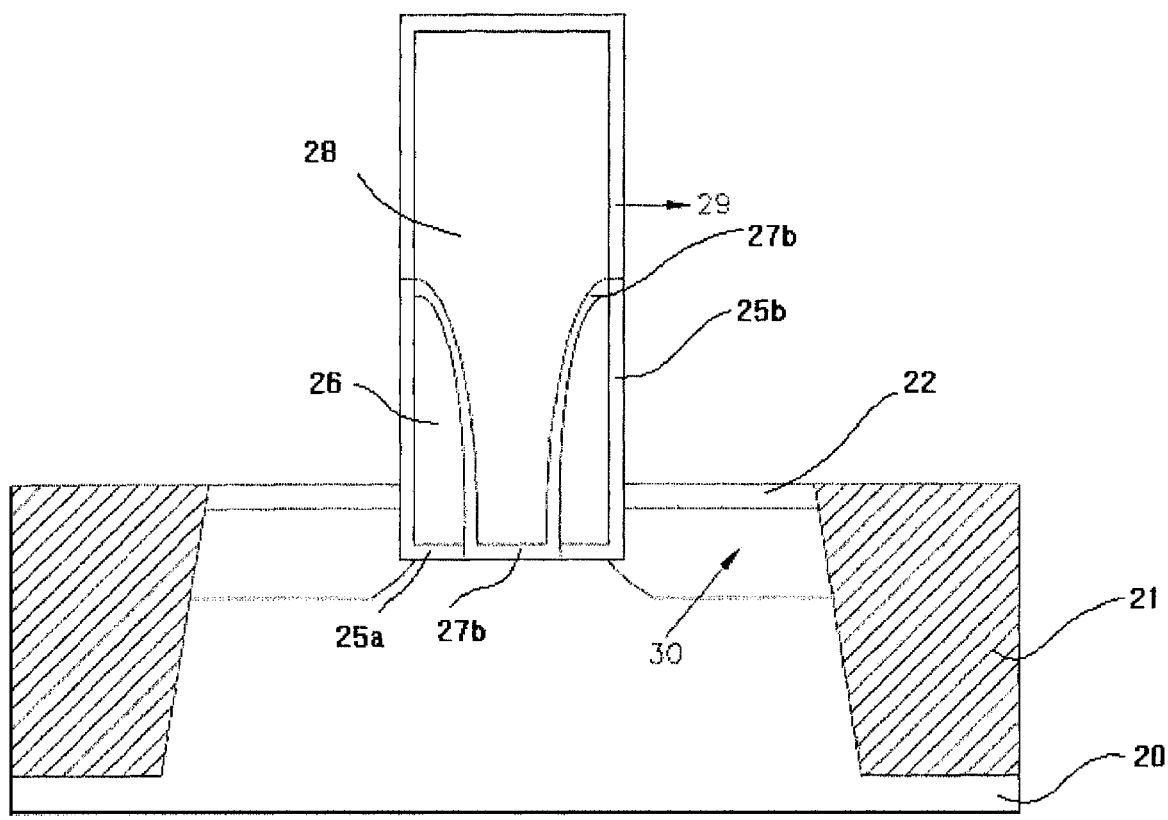

Referring to FIG. 6, the buffer nitride layer 23 used as a sacrificial layer is entirely removed by a wet etch. Subsequently, a poly oxide layer 29 is formed on the exposed part of the polysilicon of the gate electrode 28. Subsequently, an ion implantation process is performed to form source and drain regions 30 using the gate electrode 28 as a mask. The buffer oxide layer 22 remaining on the semiconductor substrate 20 mitigates damages due to the ion implantation. The source and drain region 30 is completed from the surface of the semiconductor substrate 20 to the bottom of the source and drain junctions by a later silicide formation process. During the operations of the transistor, the actual height of the channel is from the bottom of the trench 24 to the bottom of the source and drain junctions. Thus, same effects as elevated source and drain structures are obtained without forming the elevated source and drain structures.

Figure 7:
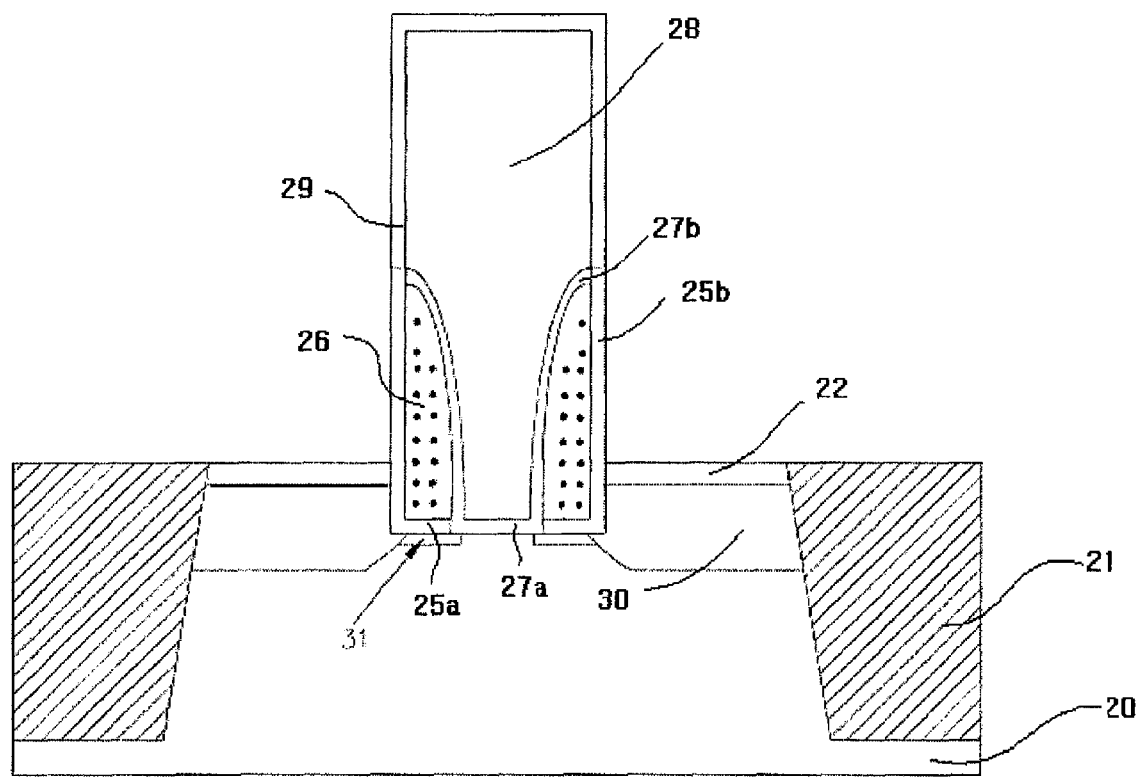

Referring to FIG. 7, electrons, holes, or negative or positive ions are injected into a potential well of the sidewall floating gates 26 surrounded by the first block oxide layer 25b and the second block oxide layer 27b through an implantation process. The holes or the positive ions are injected to make an NMOS transistor. On the other hand, the electrons or the negative ions are injected into fabricate a PMOS transistor. The threshold voltage of the sidewall floating gates 26 in either the NMOS or the PMOS transistor becomes either negative or positive, respectively, by implanting adequate electric charges into the potential well of the sidewall floating gates 26, creating strong inversion layers under the bottoms of the sidewall floating gates. As a result, virtual source and drain extension regions 31 are formed. The virtual source and drain extension regions 31 have a thickness between 5 nanometers (nm) and 10 nm. Accordingly, short channel effects can be effectively and efficiently prevented even in nano-scaled transistors.

Figure 8:
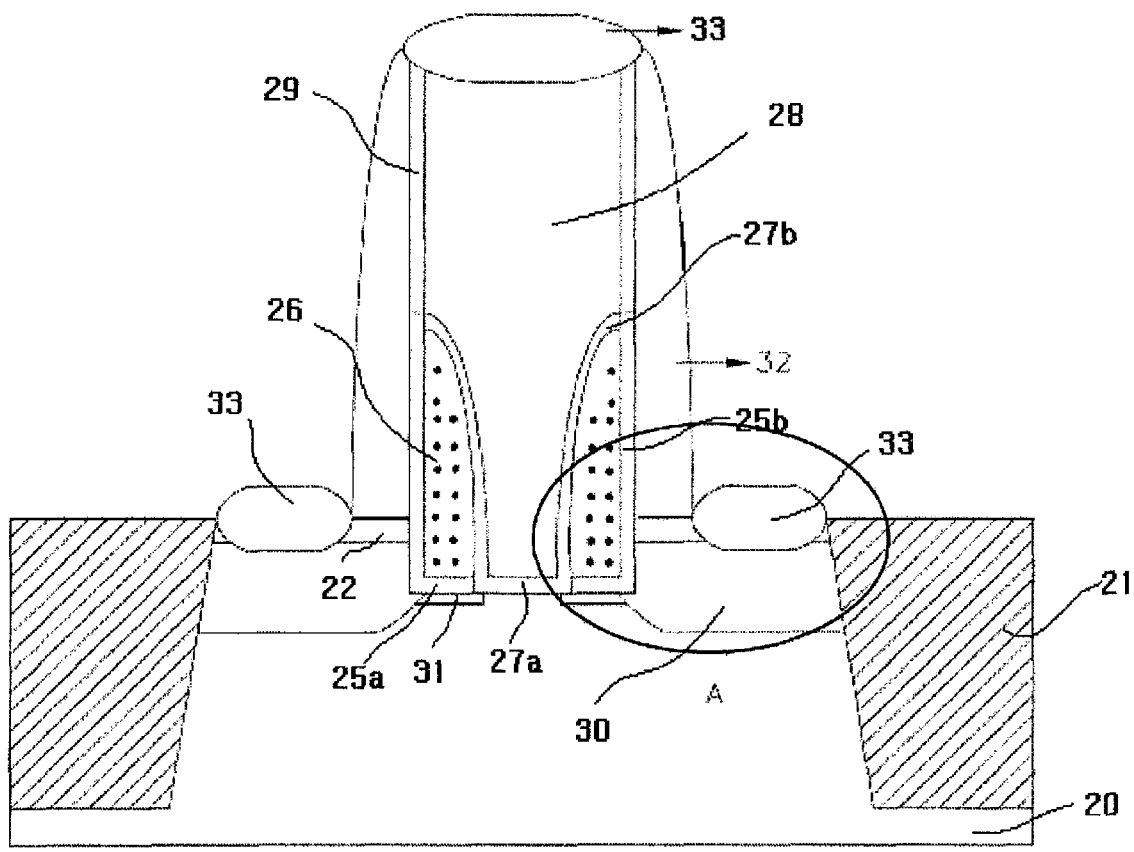

Referring to FIG. 8, spacers 32 are formed on the exposed first block oxide layer 25b on the lateral faces of the sidewall floating gates 26 and the poly oxide layer 29 of sidewalls of the gate electrode 28. The spacers 32 are made of oxide or multi-layer comprising oxide and nitride. Preferably, the spacers 32 are made of nitride. Subsequently, a silicide layer 33 is formed on the top of the gate electrode 28 and the source and drain regions 30 by a common silicide formation process.

Figure 9:
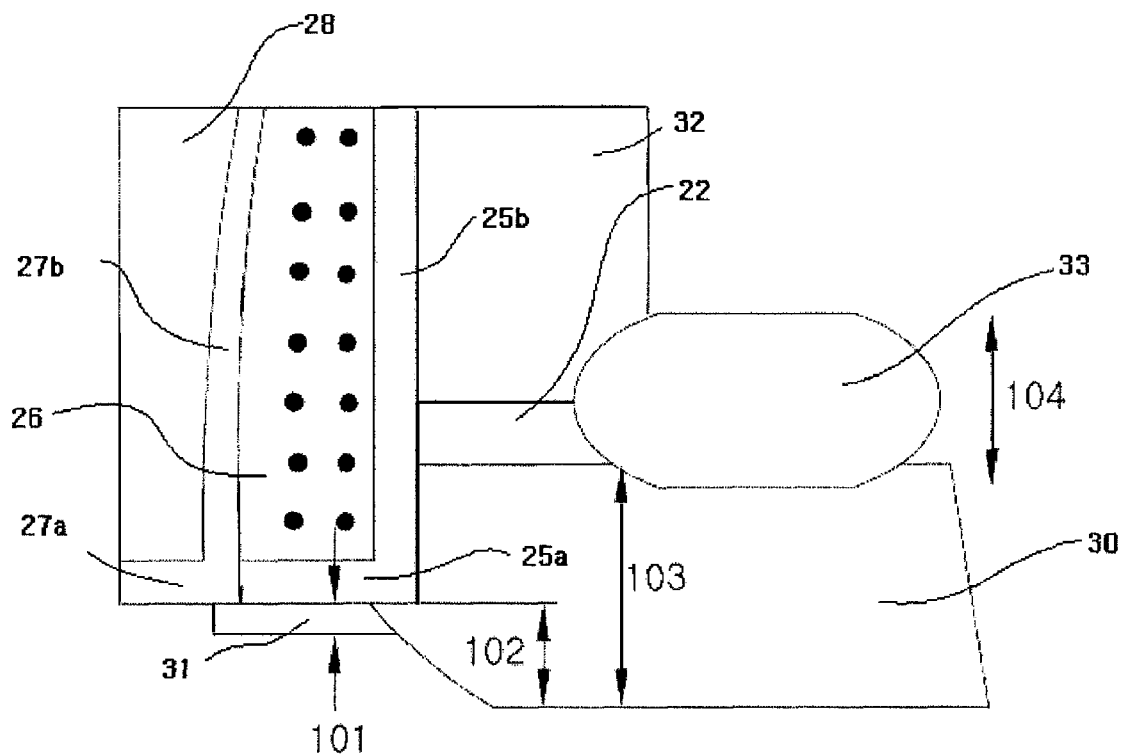
FIG. 9 is the enlarged-view of the part A in FIG. 8.

FIG. 9 is the enlarged-view of the part A in FIG. 8. Referring to FIG. 9, because the thickness 104 of the silicide layer 33 formed on the source and drain regions 30 is thinner than the depth 103 of the source and drain junctions, junction leakage is not generated even in a thick silicide layer on the source and drain regions 30. The distance 102 from the bottom of the trench 24 to the source and drain junctions actually affects the source and drain regions 30 during the operations of the transistor. Therefore, although the size of the transistor decreases in nano-scale fabrication, the junction leakage and the short channel effects can be effectively prevented by just reducing the distance 102 from the bottom of the trench to the bottom of the source and drain junctions without changing the depth 103 of the source and drain regions 30. In addition, very narrow virtual source and drain extension regions 31 can be made to suppress the occurrence of the short channel effects.

As disclosed herein, such a structure and process for fabricating the structure can suppress the short channel effects by forming the trench on the semiconductor substrate and the virtual source and drain extension regions with a width between 5 nm and 10 nm regardless of the thickness of the silicide layer. In addition, instead of forming source and drain extension regions by an ion implantation, as disclosed herein the virtual source and drain regions are formed as the strong inversion layer, therefore preventing leakage current due to diminution of BVdss value and the connection of the source region and the drain region during a later process. Moreover, the disclosed structure can form a thick silicide layer, thereby minimizing parasitic resistance and junction leakages and fabricating nano-scaled transistors.

It is noted that this patent claims priority from Korean Patent Application Serial Number 10-2003-0101101, which was filed on Dec. 31, 2003, and is hereby incorporated by reference in its entirety.

Although certain example methods, apparatus, and articles of manufacture have been described herein, the scope of coverage of this patent is not limited thereto. On the contrary, this patent covers all methods, apparatus, and articles of manufacture fairly falling within the scope of the appended claims either literally or under the doctrine of equivalents.

What is claimed is:

1. A method for fabricating a semiconductor device comprising:
   (a) forming a buffer oxide layer and a buffer nitride layer on the top surface of a semiconductor substrate;
   (b) forming a photoresist pattern on the pad nitride layer and forming a trench by etching the buffer nitride layer, the buffer oxide layer, and the semiconductor substrate by a predetermined etch using the photoresist pattern as a mask;
   (c) forming sidewall floating gates on the lateral faces of the trench;
   (d) depositing polysilicon on the semiconductor substrate including filling the trench;
   (e) patterning the polysilicon to form a gate electrode;
   (f) removing the buffer nitride layer after forming the gate electrode, and forming a poly oxide layer on the exposed part of the polysilicon of the gate electrode;
   (g) forming source/drain regions by implanting impurities into the semiconductor substrate, wherein the source region is elevated to the same level as the drain region;
   (h) injecting electric charges into the sidewall floating gates; and
   (i) forming spacers on the lateral faces of the sidewall floating gates and the gate electrode.

2. A method as defined by claim 1, further comprising forming a silicide layer on the source and drain regions and the top of the gate electrode.

3. A method as defined by claim 1, further comprising depositing a first block oxide layer on the bottom of the trench and a first gate oxide layer on the lateral faces of the trench before forming the sidewall floating gates.

4. A method as defined by claim 3, further comprising removing the exposed first gate oxide layer between the sidewall floating gates and forming a second gate oxide layer where the first gate oxide layer was removed and a second block oxide layer on the surface of the sidewall floating gates before depositing polysilicon on the entire surface.

5. A method as defined by claim 1, wherein the trench is etched in a depth between 200 Å and 2000 Å.

6. A method as defined by claim 1, wherein virtual source and drain extension regions are formed by an strong inversion layer under the trench of the sidewall floating gates by injecting electric changes into the sidewall floating gates.

7. A method as defined by claim 6, wherein the virtual source and drain extension regions has a depth between 5 nanometers and 10 nanometers.

8. A method as defined by claim 1, wherein the source region is provided at one side of the trench and the drain region is provided along the same horizontal plane at the opposite side of the trench.

9. A method as defined by claim 1, wherein at least a portion of the gate electrode is in the trench.

10. A method as defined by claim 1, wherein at least a portion of the sidewall floating gates are in the trench.

11. A method as defined by claim 1, further comprising a silicide layer on the source and drain regions, wherein a thickness of the silicide layer is thinner than a depth of the source and drain junctions.

* * * * *